US005469068A

United States Patent [19]

Katsuma

[11] Patent Number: 5,469,068

[45] Date of Patent: Nov. 21, 1995

[54] THERMAL PRINTER AND DEVICE AND METHOD FOR MEASURING RESISTANCE OF THERMAL HEAD OF THERMAL PRINTER

[75] Inventor: Nobuo Katsuma, Saitama, Japan

[73] Assignee: Fuji Photo Film Co., Ltd., Japan

[21] Appl. No.: 113,807

[22] Filed: Aug. 31, 1993

[30] Foreign Application Priority Data

Sep. 1, 1992 [JP] Japan .................................... 4-233626

[51] Int. Cl.[6] ............................... G01R 27/02; B41J 2/35

[52] U.S. Cl. ........................... 324/678; 324/658; 347/211

[58] Field of Search ..................................... 324/549, 658, 324/677, 678, 711; 347/210, 211; 320/1

[56] References Cited

U.S. PATENT DOCUMENTS 4,409,600 10/1983 Minowa .................................. 347/211

FOREIGN PATENT DOCUMENTS 61-213169 9/1986 Japan .
2248262 10/1990 Japan .

*Primary Examiner*—Kenneth A. Wieder
*Assistant Examiner*—Diep Do

[57] ABSTRACT

A resistance measuring method and device for a thermal head, and a thermal printer using the resistance measuring device. From among a plurality of parallel connected heating elements of the thermal head, the heating element whose resistance is to be measured is set ON, while other heating elements are set OFF. A capacitor connected in parallel to the heating elements is discharged through the conductive one of the heating elements, while being disconnected from a power supply for charging the capacitor, and a discharge time required to discharge the capacitor down to a predetermined voltage level is measured. A resistance value of the heating element is calculated based on the measured discharge time.

21 Claims, 9 Drawing Sheets

THERMAL PRINTER AND DEVICE AND METHOD FOR MEASURING RESISTANCE OF THERMAL HEAD OF THERMAL PRINTER

BACKGROUND OF THE INVENTION

1. Field of the Invention

The present invention relates to a thermal printing method and a thermal printer wherein image data is corrected depending on resistance of each heating element of a thermal head. The present invention also relates to a method of measuring resistance of the thermal head and a device therefor.

2. Related Art

A thermosensitive color recording material has been suggested, for example, in Japanese Laid-open Patent Application 61-213169, which has thermosensitive coloring layers for yellow, magenta and cyan which are laminated or formed on a supporting material in this order from the outside. In this type of recording material, the heat sensitivities of the thermosensitive coloring layers (hereinafter referred to as coloring layers) become lower as the distance from the outside surface increases. Furthermore, the coloring layers have properties that each coloring layer is optically fixed by electromagnetic rays of a respective specific wave length range. Therefore, recording of a full-color image on the above-described thermosensitive color recording material is performed in the order from the top or outermost coloring layer to the inner coloring layer, while optically fixing the just recorded coloring layer prior to recording the next coloring layer, so as to avoid undesirable double recording.

The thermal printer has a thermal head having a plurality of heating elements which are connected in parallel to one another and arranged in an array. The thermal head gives a variable amount of heat energy to the color thermosensitive recording layer depending on the sensitivity of the color recording layer to be color developed. Specifically, first a bias heat energy is applied for heating the thermosensitive color recording material up to such a temperature above which a predetermined color begins to be developed in the corresponding color recording layers, the amount of bias heat energy is constant and determined according to the sensitivity of each color recording layer. Next, a variable amount of gradation heat energy necessary for developing the color at desirable density is applied.

To reproduce a fine gradation, it is necessary to accurately control the amount of gradation heat energy. In general, the heating elements are activated or power conducted for about several milliseconds or several ten milliseconds for the bias heating. On the other hand, the conduction time of the heating elements is controlled at an accuracy of several micro seconds or several tens micro seconds.

In spite of such a fine control of heating or conduction time of the heating elements, the consequent image cannot exactly reproduce the desired fine gradation unless all the heating elements of the same thermal head have a completely uniform resistance value. However, in general the heating elements has a variation of about 5% in resistance. For this reason, the printed images tend to have imperfections, such as chromatic unevenness, due to the unevenness of the thermal elements.

To avoid such troubles, a thermal printer has been known, for example, from Japanese Laid-open Patent Application No. 2-248262, wherein resistance values of all the hundreds of heating elements of the thermal head are measured to correct image data based on the results of measurement. In this thermal printer, a capacitor for noise absorption is connected between a pair of power supply terminals through a switch device, and the heating elements are driven by power supplied from the power supply terminals. In a resistance measuring mode, the switch device is turned OFF to inactivate the capacitor. Thereafter, power supply voltage E is applied to one of the heating elements, and a voltage V on that heating element is measured. Then, a resistance value "r" of the heating element is calculated according to an equation $r=\{V/(E-V)\}\cdot R$, wherein R is a resistance value of a reference resistor connected between the power supply and the thermal head. This process is executed relating to each heating element, so as to correct image data on the basis of the detected resistance values.

Because the above-described known thermal printer measures the voltage V drop through the heating element, while the noise absorbing capacitor from the power supply is disconnected by turning the switch OFF, the results of measurement tend to be scattered because of the extraneous noise. Furthermore, because the known method requires not only the specific switch but also a device for measuring the voltage V, for example, an analog-digital converter, the construction of the known thermal printer is complicated.

SUMMARY OF THE INVENTION

In view of the foregoing, an object of the invention is to provide a thermal printer having a device for measuring resistance of a thermal head, which is simple in construction and is not affected by noise.

Another object of the invention is to provide a resistance measuring method for a thermal head, by which the results of measurement are not affected by noise, and a device for executing the resistance measuring method, which can be simple in construction.

To achieve the above objects, according to the invention, a capacitor connected in parallel to the heating elements is discharged through one of the heating elements, and a discharge time taken to discharge the capacitor down to a predetermined voltage level through the one heating element is measured. Based on the measured discharge time, a resistance value of the heating element is calculated.

Because the measurement is completed for each heating element before the capacitor has been fully discharged, the speed of measurement also improved.

According to the invention, a resistance measuring device for a thermal head, which has an array of parallel connected heating elements which are heated by a voltage supplied from a power supply circuit during printing and an array of drive switches which are connected in series to the heating elements in one to one relation, is comprised of a capacitor connected to the power supply circuit in parallel with the heating element array; and a charge switch device connected between the power supply circuit and the capacitor. The charge switch device is turned ON to charge the capacitor up to a first voltage level, for example the level of the power supply voltage, by the power supply circuit, and turned OFF to disconnect the heating element and the capacitor from the power supply circuit.

The resistance measuring device further has a device for measuring discharge time taken to discharge the capacitor from the first voltage level to a second voltage level or a reference level when the charge switch device is turned OFF and one of the drive switch is turned ON to discharge the capacitor through a corresponding one of the heating elements; and a device for calculating a resistance value of the corresponding one of the heating elements on the basis of the measured discharge time.

A thermal printer of the invention is comprised by the above-described resistance measuring device, a switch control circuit for ON-OFF controlling of the drive switches of the thermal head, and a device for correcting image data on the basis of resistance values of the heating elements detected through the calculating device.

The present invention makes it possible to measure the resistance values of the heating elements with high accuracy without the need for a complicated device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects and advantages of the invention will become apparent from the following detailed description of the preferred embodiments when read in conjunction with the accompanying drawings, which are given by way of illustration only and thus are not limitative of the present invention, and wherein.

DETAILED DESCRIPTION OF THE PREFERRED EMBODIMENTS

Figure 1:
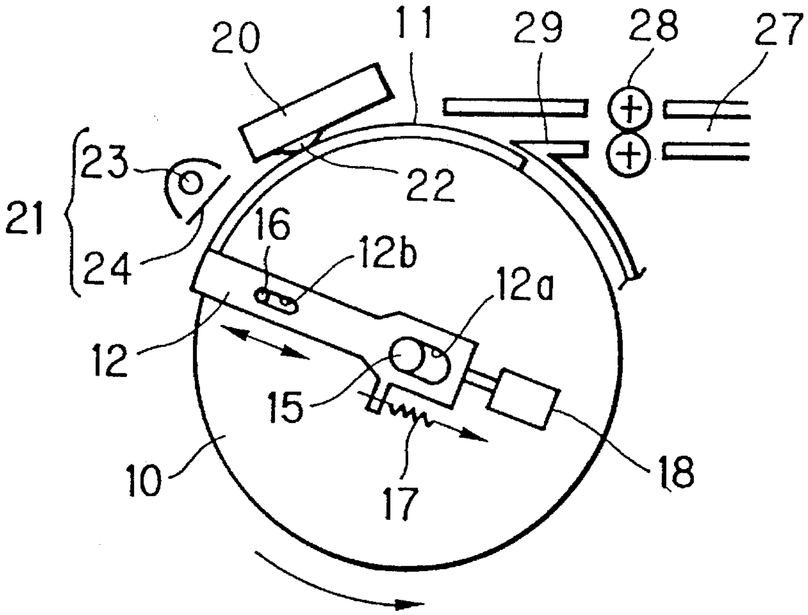
FIG. 1 is a schematic view of a direct color thermal printer having a thermal head whose resistance is measured according to the present invention.

In FIG. 1, a platen drum 10 carries a thermosensitive color recording paper 11 on the outer periphery thereof, and is rotated by a pulse motor (not shown) in a direction of an arrow during thermal recording. The platen drum 10 is provided with a clamp member 12 which secures the thermosensitive color recording paper 11 to the platen drum 10 at least at a portion, for example, at the leading end of the thermosensitive color recording paper 11. The clamp member 12 is of a channel shape having a clamp portion extending in an axial direction of the platen drum 10 and arm portions extending in a radial direction of the platen drum 10. Slots 12*a* and 12*b* are formed in either arm portion. The slots 12*a* are engaged with both ends of a platen drum shaft 15, and the slots 12*b* are engaged with guide pins 16 provided on both sides of the platen drum 10. The clamp portion of the clamp member 12 is ordinarily pressed onto the platen drum 10 by a spring 17, and is removed off the platen drum 10 by an act of a solenoid 18 when the thermosensitive color recording paper 11 is to be placed on or displaced from the platen drum 10.

Above the outer periphery of the platen drum 10, a thermal head 20 and an optical fixing device 21 are disposed. The thermal head 20 has a heating element array 22 which sequentially radiates constant bias heat energy and variable heat energy for reproducing gradation depending on the recording density of each pixel. The optical fixing device 21 includes a stick-shaped ultraviolet lamp 23 and a sharp cut filter 24 movable in front of the ultraviolet lamp 23.

Figure 2:
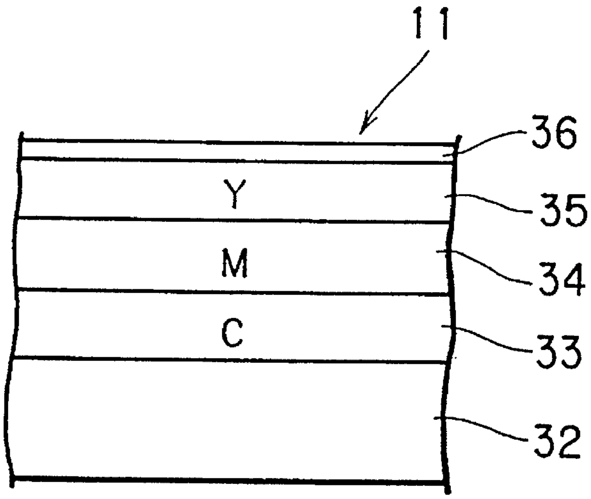
FIG. 2 is an explanatory view of the construction of a thermosensitive color recording material.

FIG. 2 shows an example of the thermosensitive color recording paper 11, wherein a cyan recording layer 33, a magenta recording layer 34 and a yellow recording layer 35 are formed on a supporting material 32 in this order from the inside. The supporting material 32 is an opaque coated paper or plastic film. However, when an OHP (over-head projector) sheet is desired to be made, a transparent plastic film is used as the supporting material. A layer 36 is formed on the yellow recording layer 35.

The cyan recording layer 33 contains an electron donating dye precursor and an electron accepting compound as main components, and is colored cyan when a predetermined amount of heat energy per unit area is applied thereto. The magenta recording layer 34 contains a diazonium salt compound having a maximum absorption factor at a wave length of about 360 nm and a coupler which acts upon the diazonium salt compound and is developed in magenta when it is heated. The magenta recording layer 34 loses its capacity of color-developing when it is exposed to electromagnetic or ultraviolet rays of about 360 nm, because the diazonium salt compound is photochemically decomposed by this range of rays. The yellow recording layer 35 contains a second diazonium salt compound having a maximum absorption factor at a wave length of about 420 nm and a coupler which acts upon the second diazonium salt compound and is colored in yellow when it is heated. The yellow recording layer 35 also loses its color developability when it is exposed to electromagnetic or near ultraviolet rays of about 420 nm.

Figure 3:
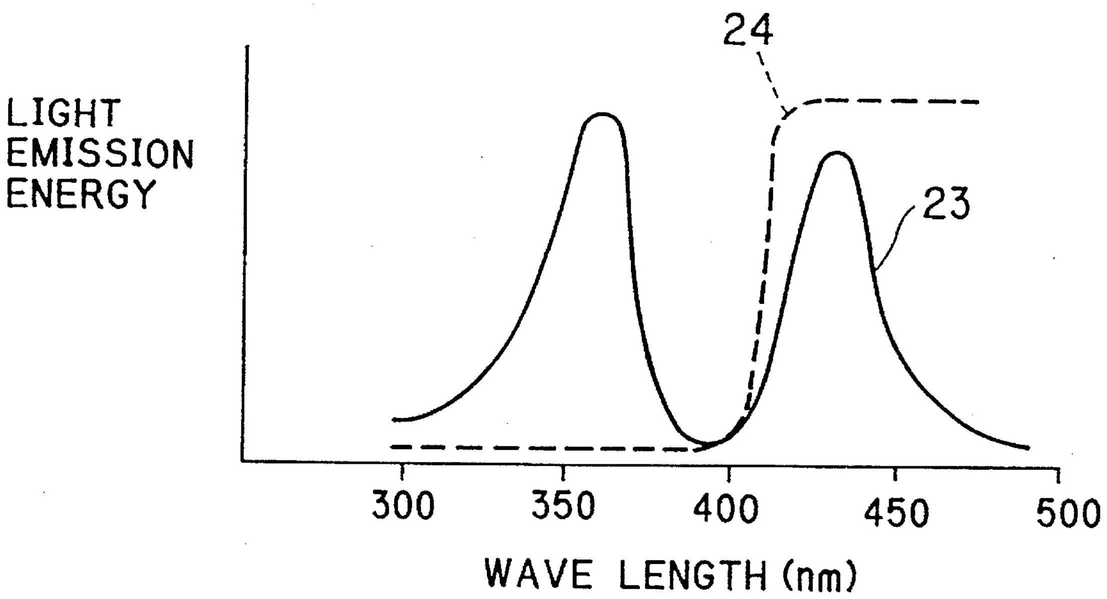
FIG. 3 is a graph showing characteristic curves of an ultraviolet lamp and a sharp-cut filter of an optical fixing device of the direct color thermal printer.

In correspondence with the above properties of the thermosensitive color recording paper, the ultraviolet lamp 23 of the optical fixing device 21 has two emission centers at wave lengths of 365 nm and 420 nm, as shown by solid line curve in FIG. 3, and the sharp-cut filter 24 has a transmission curve as shown by dashed line FIG. 3. The sharp-cut filter 24 is placed on the front of the ultraviolet lamp 23 by means of a solenoid or another device, so as to transmit near ultraviolet rays having a wave length range about 420 nm when fixing the yellow recording layer.

The thermosensitive color recording paper 11 is fed to the platen drum 10 through a paper passageway 27 by means of a pair of feed rollers 28. After printing, the thermosensitive color recording paper 11 is ejected from the platen drum 10 through the paper passageway 27. In the vicinity of the paper passageway 27, on the side near to the platen drum 10, a peeling member 29 is provided for peeling off the trailing end of the thermosensitive color recording paper 11 from the platen drum 10 and guiding the thermosensitive color recording paper 11 to the paper passageway 27 when ejecting the thermosensitive color recording paper. Although the paper passageway 27 is commonly used for paper feeding and ejecting, it is possible to provide a paper ejection path separately from a paper feed path.

Figure 4:
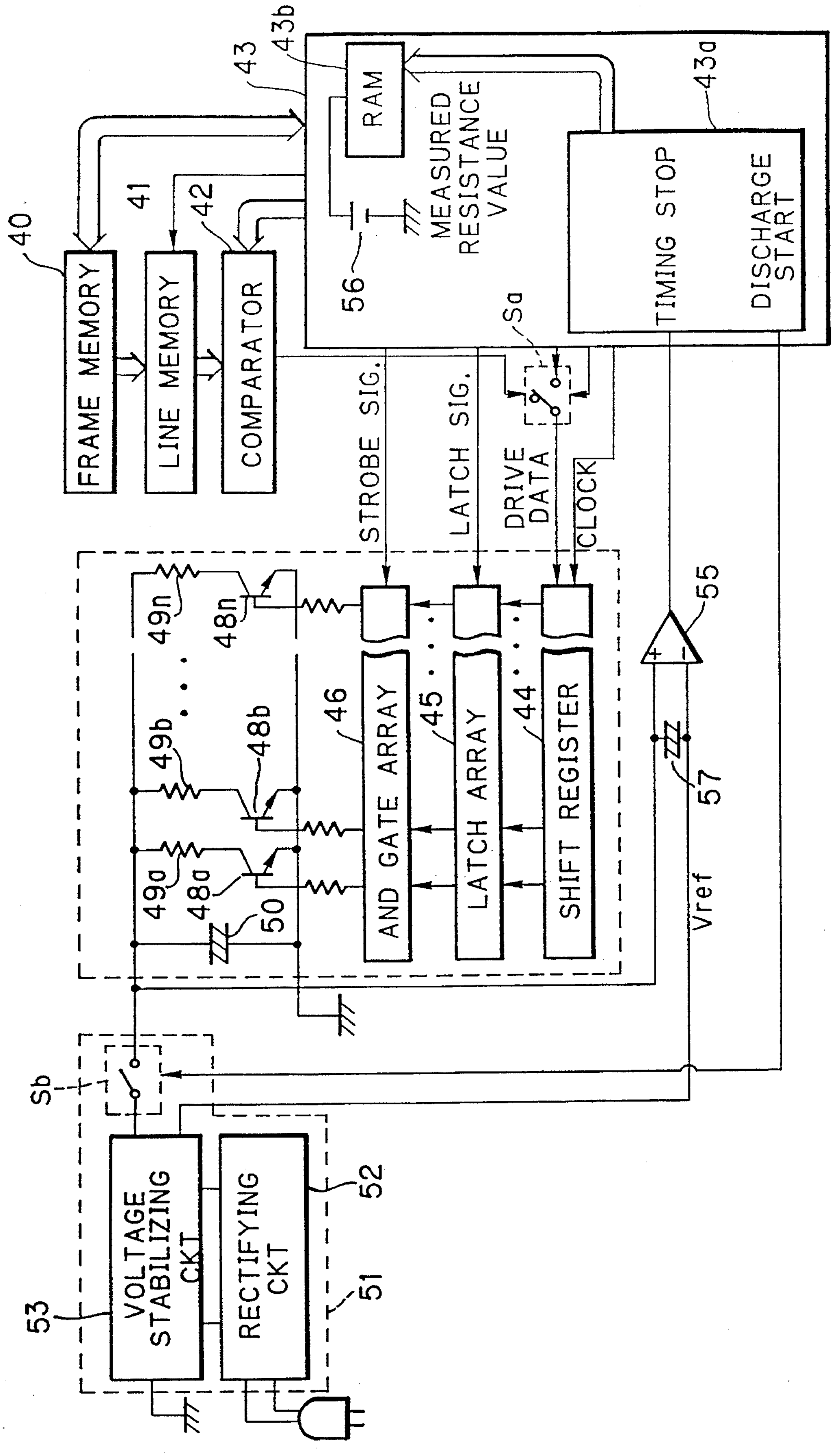
FIG. 4 is a block diagram showing the circuitry of the direct color thermal printer having a resistance measuring device for the thermal head, according to an embodiment of the present invention.

FIG. 4 shows the circuitry of a direct color thermal printer embodying the present invention. Color image data is inputted through a not shown image input device such as a color scanner, a color television camera or the like, and subjected to three primary color separation, color and density correction, and other processing. The processed image data of one frame is stored in a frame memory 40 separately for each color. In thermal recording, the image data are read out for each color and line by line from the frame memory 40, and is written in a line memory 41. The image data of one line is read out from the line memory 41, and is serially sent to a comparator 42. The comparator 42 compares the image data with gradation data as reference data for predetermined tonal steps, and outputs a high level signal "H" when the image data of that pixel is larger than the compared gradation data.

The gradation data is serially generated by a microcomputer 43 in the order from the lowest tonal step, for example, 64 gradation data "0" to "3F" in the hexadecimal notation are generated if the gradation is constituted of 64 tonal steps. The comparator 42 compares the image data for each pixel of one line with the respective gradation data "0" to "3F". After the image data of each pixel of one line is compared with the first gradation data "0", the results of the comparison are outputted from the comparator 42 in the form of a serial signal, and the microcomputer 43 generates and supplies the second gradation data "1" to the comparator 42. The serial signal is sent to a shift register 44 of the thermal head 20 through a first switch Sa, which is used to switch the thermal printer between a print mode and a resistance measuring mode. In this way, the image data of each pixel is compared 64 times so as to be converted into 64-bit drive data for each pixel. In other words, the 64-bit drive data is sent to the shift register 44 by transferring the serial signals 64 times from the comparator 42 to the shift register 44.

The serial drive data is shifted in the shift register 44 at the timing of a clock signal, so as to be converted into a parallel form. The parallel drive data is latched in a latch array 45 in synchronism with a latch signal. The latch array 45 includes a number of elements corresponding to the number "n" of the pixels consisting of one line (n=an integer). The parallel outputs of the latch array 45 are connected to an AND gate array 46 including the corresponding number "n" of AND gates. The AND gate array 46 receives a strobe signal. If the one bit of the 64-bit drive data that is just applied to a first input of one AND gate is high when the strobe signal is applied to a second input of that AND gate, the AND gate outputs a high level signal "H".

The parallel outputs of the AND gate array 46 are connected to transistors **48*a* to 48*n* in one to one relation, each of which is turned ON when the allocated output of the AND gate array 46 takes the high level "H". The transistors 48*a* to 48*n* are connected in series to the plurality of heating elements 49*a* to 49*n* of the thermal head 20 in one to one relation. Each heating element 49*a* to 49*n*** is constructed by a resistance.

A capacitor 50 is connected in parallel to the heating elements **49*a* to 49*n*, which is used for the resistance measurement and the noise absorption. A power supply section 51 is connected to the heating elements 49*a* to 49*n* through this capacitor 50. The power supply section 51 is constituted of a second switch Sb, a regulating circuit 52 and a voltage stabilizing circuit 53. The second switch Sb is maintained closed or in an ON position, in the print mode. But in the resistance measuring mode, the second switch Sb is turned OFF and ON under the control of the microcomputer 43 each time the resistance values Ra to Rn of the heating elements 49*a* to 49*n*** are measured.

A first terminal of the capacitor 50 is connected to a non-inverted input of a comparator 55 whose reference voltage Vref is tapped from the voltage stabilizing circuit 53 by resistance voltage division. In the resistance measuring mode, the second switch Sb is turned OFF after the capacitor is fully charged, so as to turn one of the transistors **48*a* to 48*n* ON that is associated with the heat element whose resistance is to be measured. For instance, when the resistance of the heat element 49*a* should be measured, the transistor 48*a* is turned on. The voltage level $V_H$ of the non-inverting input of the comparator 55 has a value $E_H$ if the capacitor 50 is fully charged, and decreases with the discharge of the capacitor 50 through the heating element 49*a* down to the same level as the reference voltage Vref. Immediately thereafter, the voltage level of the output of the comparator 55 changes over from a positive to a negative value. The microcomputer 43 includes a resistance measuring section 43*a* which measures a time duration or a discharge time Ta from the OFF-turning of the switch Sb to the inversion of the output of the comparator 55. The resistance measuring section 43*a* calculates a resistance value Ra of the heating element 49*a* based on the discharge time Ta, and writes the resistance value Ra in a RAM 43*b* incorporated in the microcomputer 43**.

The resistance of the heating elements **49*a* to 49*n*** can be calculated based on the discharge time in the following manner:

The voltage level $V_H$ of the non-inverting input of the comparator 55 can be defined as:

$$V_H = E_H \cdot e^{-T/CR} \quad (1)$$

wherein $E_H$ is power supply voltage, T is a discharge time of a heating element measured by the resistance measuring section **43*a*, C is capacity of the capacitor 50**, and R is a resistance value of the corresponding heat element.

According to the above equation (1), when $V_H$=Vref the factor $e^{-T/CR}=1/2$ under the condition that Vref=½ $E_H$. Therefore, $$R = T/0.693C \quad (2)$$

Because the capacity C of the capacitor 50 is a constant, the resistance R of the heating element depends on the discharge time T. In the printing mode, the image data of each pixel is corrected depending on the resistance R of the corresponding heating element calculated according to the equation (2).

A backup battery 56 is incorporated in the microcomputer 43, for supplying power to RAM **43*b* which stores resistance values Ra to Rn even when the supply voltage breaks down. Furthermore, a capacitor 57 is connected between leads of the comparator 55 for eliminating noise from the leads. The capacitor 57 has smaller capacitance than the capacitor 50 so that the capacitor 57** has very little influence on the resistance measurement and may not cause errors nor elongate the measuring time.

Next, the operation of the above-described direct color thermal printer will be described with reference to FIGS. 5 to 7.

Figure 5:
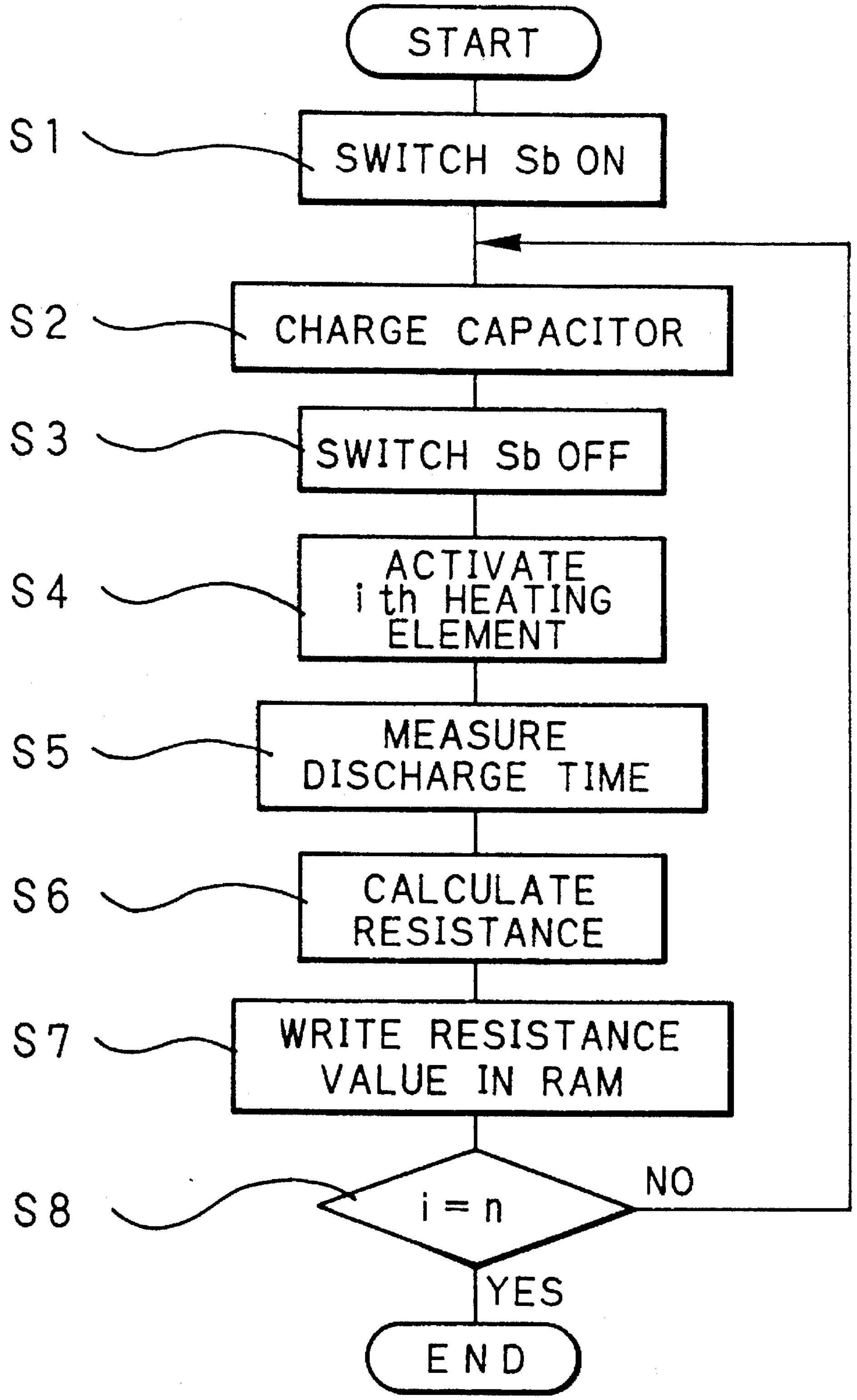
FIG. 5 is a flow chart of the resistance measuring mode of the direct thermal printer shown in FIG. 4.

As illustrated in FIG. 5, during the initial setup operation, the thermal printer is switched to the resistance measuring mode through the first switch Sa, so as to connect the shift register 44 to the microcomputer 43. The microcomputer 43 outputs such control data that turns the transistor *48a* ON and other transistors *48b* to *48n* OFF. Then in step S7, the resistance measuring section *43a* turns the second switch Sb ON so as to start charging the capacitor 50. After the voltage charged in the capacitor 50 reaches the value $E_H$ in step S2, the second switch Sb is turned OFF in step S3. As a result, the capacitor 50 is discharged through the heating element *49a* in step S4. Thus, the voltage applied to the non-inverting input of the comparator 55 gradually decreases. When the capacitor 55 detects the coincidence between the voltage level at the non-inverting input thereof and the reference voltage Vref, the resistance measuring section *43a* measures discharge time Ta in step S5, so as to calculate resistance value Ra of the heat element *49a* in step S6 according to the equation (2). The resistance value Ra is written in the RAM *43b* in step S7.

Thereafter, the microcomputer 43 turns the transistor *48b* ON and other transistors *48a, 48c* to *48n* OFF. The resistance measuring section *43a* then measures discharge time Tb of the transistor *48b* through the heating element *49b,* and calculates resistance value Rb of the heating element *49b* based on the discharge time Tb. After memorizing the resistance value Rb, the third transistor *48c* is turned ON, so as to detect resistance value Rc of the third heating element *49c.* In this way, resistance values Ra to Rn of the heating elements *49a* to *49n* are measured and written in the RAM *43b.* In step S8, it is determined if the process is completed for all the heating elements.

To set the print mode, the first switch Sa is switched over to connect the shift register 44 to the comparator 42. In the print mode as illustrated in FIG. 7, first the image data of a frame of full color image is written in the frame memory 40 separately for each color. The image data is corrected by using correction data which is calculated for each heating element based on a difference between the actual resistance value thereof, which has been measured and written in the RAM *43b* as described above, and an ideal resistance value. The ideal value is common to all the heating elements *49a* to *49n* at which the resistance values of the heating elements *49a* to *49n* are completely uniform. Because of this correction, the pixels can be correctly recorded even when the actual resistance values Ra to Rn of the heating elements *49a* to *49n* have variance relative to the ideal value.

During paper feeding, the platen drum 10 stays in a situation where the clamp member 12 is placed at the exit of the paper passageway 27 with its arm portions oriented vertically in FIG. 1. When the solenoid 18 is energized, the clamp member 12 is set to a clamp release position where the clamp portion thereof is removed off the platen drum 10. The pair of feed rollers 28 nip and feed the thermosensitive color recording paper 11 toward the platen drum 10. The feed rollers 28 stop rotating when the leading end of the thermosensitive color recording paper 11 is placed between the platen drum 10 and the clamp member 12. Thereafter when the solenoid 18 is turned OFF, the clamp member 12 is returned to the initial position according to the act of the spring 17, thereby clamping the leading end of the thermosensitive color recording paper 11. After clamping the thermosensitive color recording paper 11, the platen drum 10 and the feed rollers 28 start rotating, so that the thermosensitive color recording paper 11 is wound on the outer periphery of the platen drum 10.

The platen drum 10 is rotated intermittently by a predetermined step. When a leading edge of a recording area of the thermosensitive color recording paper 11 reaches the thermal head 20, first the recording of a yellow frame of the full-color image is started. During the yellow frame recording, the image data of one line of the yellow frame are read out from the frame memory 40, and are temporarily written in the line memory 41.

Then, the image data are read out from the line memory 41, and are sent to the comparator 42 wherein the image data is compared with the first gradation data of the lowest density "0". The comparator 42 outputs a high level signal "H" for a pixel to be recorded as a yellow dot, and outputs a signal "L" for such a pixel to have no yellow dot. The results of comparison are sent to the shift register 44 in the form of serial drive data. The serial drive data is shifted by the clock in the shift register 44 so as to be converted into parallel drive data. The parallel drive data is latched in the latch array 45 and then sent to the AND gate array 46.

Figure 6:
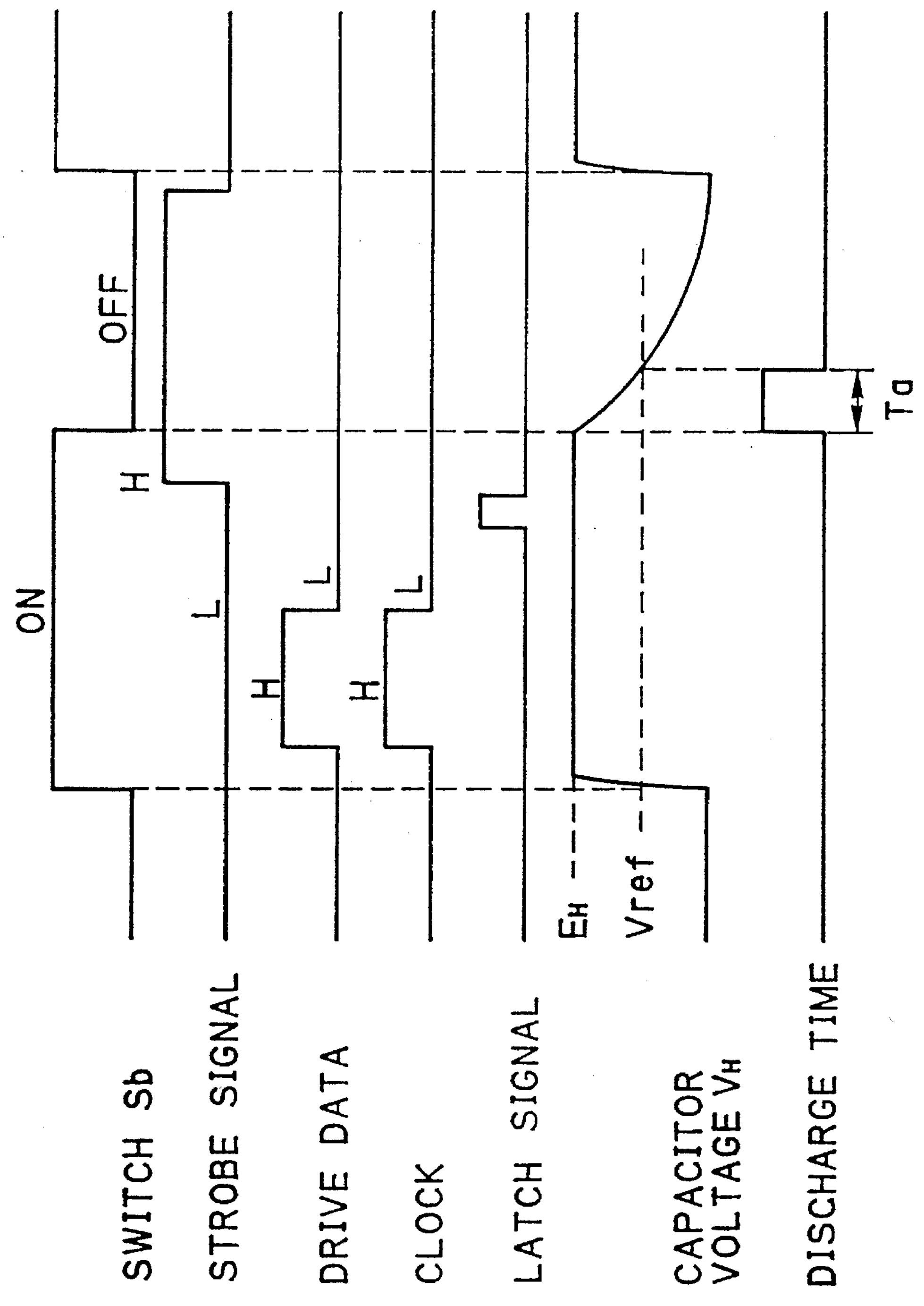
FIG. 6 shows time charts of signals applied to the respective circuits shown in FIG. 4.
Figure 7:
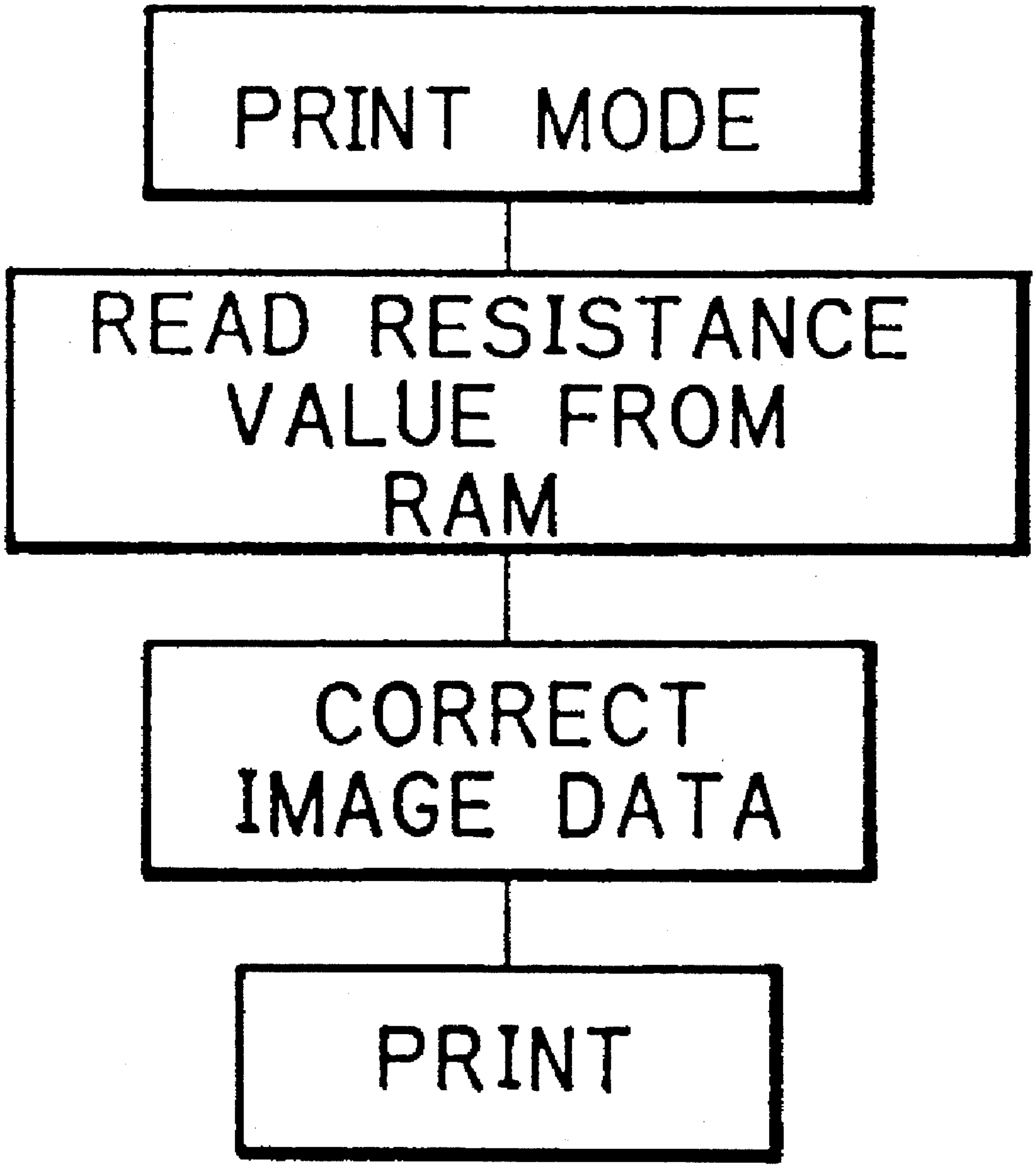
FIG. 7 is a flow chart of the print mode of the direct thermal printer shown in FIG. 4.

At that time, the microcomputer 43 outputs a bias heating pulse having a relatively large width as a first strobe signal illustrated in FIG. 6 to the AND gate array 46. Because the AND gate array 46 outputs logical products of the strobe signal and the respective output signals of the latch array 45, high level signals "H" appear on those outputs of the AND gate array 46 which correspond to the outputs of the latch array 45 having the high level signals "H". For example, if the first output of the AND gate array 46 takes the high level, the first transistor *48a* is turned ON, so that the first heating element *49a* is activated or power is conducted for a time period corresponding to the width of the bias heating pulse. As a result, a predetermined amount of bias heat energy is applied to the thermosensitive color recording paper 11.

Before the end of the bias heating, the microcomputer 43 outputs the gradation data "1" as the reference data for the second tonal step "1" to the comparator 42. The image data of each pixel is compared with the gradation data "1". As a result of this comparison, a serial drive data is produced and written in the shift register 44. When the bias heating is complete, the microcomputer 43 generates a gradation pulse having a width less than that of the bias heating pulse. The gradation pulse is applied as a subsequent strobe signal to the AND gate array 46. In response to this strobe pulse, some of the heating elements *49a* to *49n* are activated in accordance with the drive data for a shorter time corresponding to the width of the gradation pulse, thereby to develop color on the yellow recording layer 35 at a density corresponding to the tonal step "1".

Thereafter, similar process is repeatedly carried out for recording the first line of the yellow frame on the yellow recording layer 35 until the microcomputer 43 has generated the last gradation data "3F" corresponding to the maximum density. Therefore, the heating elements *49a* to *49n* are selectively driven in accordance with the corrected image data for the first line of the yellow frame, while a single bias heating pulse and, thereafter, 1 to 64 gradation pulses are applied to as the strobe signals. For example, for recording a pixel of the maximum density, 64 pulse currents are conducted through the corresponding heating element. In this way, a line of pixels having 64 tonal steps are recorded.

After the recording of the first line of the yellow frame is complete, the platen drum 10 is rotated by an amount corresponding to one pixel. Simultaneously, the image data of the second line of the yellow frame are read out from the frame memory 40. Thereafter, the same procedure as above is repeated for recording the second and the following lines of the yellow frame. When the part of the recording paper 11 on which the yellow frame is recorded is moved under the optical fixing device 21, the optical fixing device 21 starts optical fixing of the yellow recording layer 35. At that time, because the sharp-cut filter 24 is placed in front of the ultraviolet lamp 23, the recording paper 11 is exposed to near ultraviolet rays having a wave length range about 420 nm, so that the diazonium salt compound remaining in the yellow recording layer 35 is optically discomposed to lose the coupling capacity thereof.

When the platen drum 10 makes one revolution to place the leading edge of the recording area again under the thermal head 20, a magenta frame of the full-color image begins to be recorded line by line. Although the heat energy applied for coloring the magenta recording layer 34 is larger than the heat energy for coloring the yellow recording layer 35, the yellow recording layer 35 is not colored because it has already been optically fixed. The magenta recording layer 34 having the magenta frame recorded therein is optically fixed by means of the optical fixing device 21. For the magenta recording layer fixing, the sharp-cut filter 24 is displaced from the front of the ultraviolet lamp 23, so that the recording paper 11 is exposed to all the electromagnetic rays radiated from the ultraviolet lamp 23. Among of these electromagnetic rays, ultraviolet rays having a wave length range about 365 nm optically fix the magenta recording layer 34.

When the platen drum 10 further makes one revolution so as to place the recording area under the thermal head once again, recording of a cyan frame of the full-color image begins line by line in the cyan recording layer 33. Because the heat energy necessary for coloring the cyan recording layer 33 has such a large value, the heat energy cannot be applied to the recording paper under a normal keeping condition. Therefore, cyan recording layer 33 is not given a capacity of being optically fixed. For this reason, the optical fixing device 21 is turned OFF in the cyan frame recording.

After recording the yellow, magenta and cyan frames of the full-color imaging, the platen drum 10 and the feed rollers 28 are rotated reversely. Thereby, the trailing end of the recording paper 11 is guided by the separation claw 29 into the paper passageway 27, and is nipped by the feed rollers 28. Thereafter when the platen drum 10 reaches the initial position at which the clamp member 12 is placed at the exit of the paper passageway 27, the solenoid 18 is turned on, and simultaneously the platen drum 10 stops rotating. When the solenoid 18 is turned on, the clamp member 12 is moved to the clamp release position against the act of the spring 17, so that the leading end of the recording paper 11 is released from the clamp member 12, and is ejected from the platen drum 10 through the paper passageway 27.

The resistance values Ra to Rn of the heating elements **49*a* to 49*n* having been written in the RAM 43*b* at the initial setup of the thermal printer, are preserved in the RAM 43*b* by the backup battery 56. If the battery 56 is consumed or time-worn, or if the data in the RAM 43*a* is deleted for some reason, the resistance values Ra to Rn are again measured and written in the RAM 43*b*. The backup battery 56 may be a nickel battery which can be charged by the power supply section 51. In case no backup battery is used, the data in the RAM 43*a* is erased when the power supply to the thermal printer is disconnected. Therefore, the resistance measurement should be performed at each start of power supply. It is also possible to replace the RAM 43*a* by a ROM which needs no backup power supply. In this case, the resistance values Ra to Rn may be measured and written in the ROM before the ROM is incorporated into the microcomputer 43**.

Now, another embodiment of the present invention will be described with reference to FIGS. 8 and 9.

Figure 8:
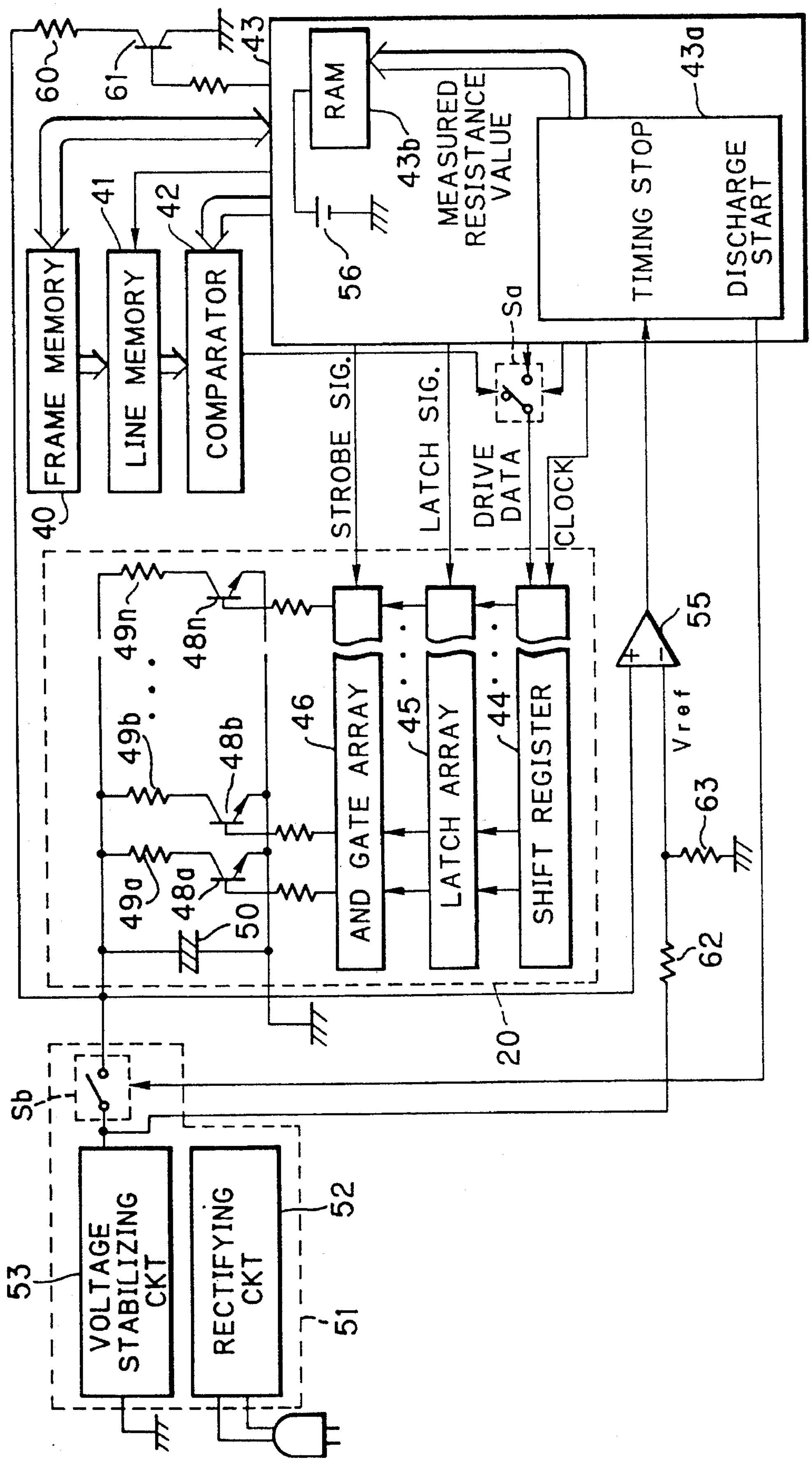
FIG. 8 is a view similar to FIG. 4 showing a resistance measuring device for the thermal head according to another embodiment of the present invention.

In this embodiment illustrated in FIG. 8, a reference resistor 60 and a transistor 61 are connected in parallel to heating elements **49*a* to 49*n* and transistors 48*a* to 48*n*. The reference resistor 60 has a known resistance value Rs whose tolerance is about 1%. A reference voltage Vref of a comparator 55 is divided from the power supply voltage $E_H$ by a using two resistors 62 and 63** having resistance values r1 and r2 respectively. Therefore, $Vref=\{r2/(r1+r2)\}\ E_H$. The reference voltage Vref defined in this way has a merit that no measurement error is caused even when the power supply voltage $E_H$ fluctuates. The resistance values r1 and r2 are defined so as to set the reference voltage Vref, for example, equal to ½ $E_H$.

To measure, for instance, resistance value Ra of the heating element **49*a*, first the thermal printer is set in a resistance measuring mode by a first switch Sa, and the transistor 61 alone is turned ON while all the transistors 48*a* to 48*n* are maintained OFF. Then, a second switch Sb is turned ON as illustrated in FIG. 9, so as to charge a capacitor 50. After the capacitor 50 is fully charged, the second switch Sb is turned OFF to discharge the capacitor 50 through the resistor 60. Discharge time Ts through the reference resistor 60 is measured from the start of discharging to a time when the voltage level $V_H$ at a non-inverting input of a comparator 55, that is, the voltage charged in the capacitor 50, decreases down to a level equal to the reference voltage Vref. Next, the transistor 48*a* alone is turned ON while other transistors 48*b* to 48*n* are maintained OFF. The second switch Sb is turned ON to charge the capacitor 50, and thereafter, turned OFF so as to measure discharge time Ta through the heating element 49*a***.

Resistance value Ra of the heating element **49*a* is calculated according to an equation $Ra=(Ta/Ts)\ Rs$. Therefore, the precision of the calculation of the resistance values Ra to Rn of the heating elements 49*a* to 49*n* does not depend upon the capacity C of the capacitor 50, but merely depends upon the precision of the resistance value Rs of the resistor 60. However, because the tolerance of the resistance value Rs is more or less 1%, the precision of the calculation of the resistance values is improved. It is to be noted that the tolerance of capacity of a capacitor is usually set at about 20%, and the price of such a capacitor is generally about five yen in Japan. Although there is an improved capacitor whose capacity tolerance is 5%, such a precise capacitor costs about 100 to 200 yen. On the contrary, the price of a resistor is about a half yen if the tolerance of resistance thereof is set at 5%. Even such a resistor whose resistance tolerance is 1% costs about one yen. Therefore, the embodiment shown in FIGS. 8 and 9** wherein the resistance measurement does not depend upon the capacity of the capacitor is economical.

It is possible to separate the function for measuring the resistance of the heating elements of the thermal head from the above-described thermal printer, and construct an independent resistance measuring device for the thermal head. Such an independent resistance measuring device may be used as a tester and connected to the thermal head when testing the same.

Figure 10:
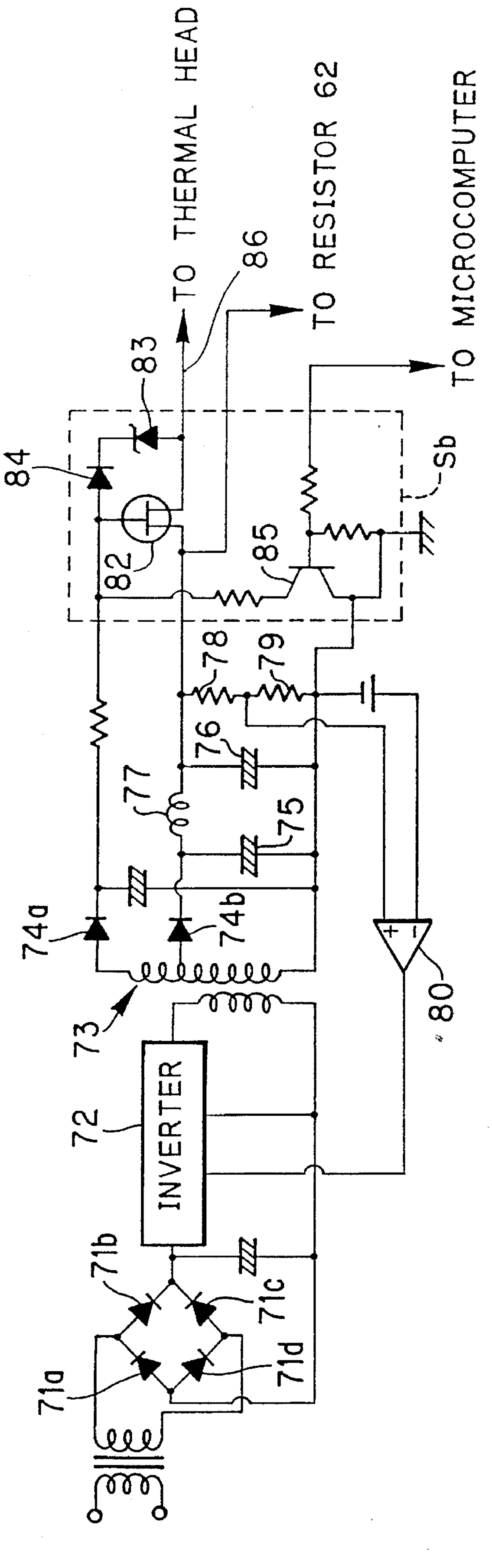
FIG. 10 is a circuit diagram of a power source section of the direct color thermal printer, according to an embodiment of the present invention.

FIG. 10 shows an example of the power supply section 51. Alternating current from a power source is converted into direct current through a bridge connection rectifier constituted of four rectifying elements **71*a* to 71*d*. The rectified current is converted again into alternating current having a higher frequency through an inverter 72, and thereafter converted into two kinds of direct current having different voltages through a transformer 73 and rectifying elements 74***a* and 74*b*. The low voltage direct current is smoothened through capacitors 75 and 76 and a coil 77. The low voltage direct current is thereafter fed back to the inverter 72 through resistors 78 and 79 and a comparator 80, so as to maintain a predetermined voltage. Thereby, the frequency is defined in the inverter 72. A connecting point between the smoothing coil 77 and the capacitor 76 is connected to the thermal head 20 through a field effect transistor (FET) 82. A Zener diode 83 and a diode 84 are connected between the gate and the source of the FET 82. The Zener diode 83 is used to maintain the voltage on the gate-source circuit constant. The diode 84 prevents reverse current when the FET 82 is turned OFF.

The transistor 85 is usually in the OFF condition, so that the FET 82 is in the ON condition. Therefore, the switch Sb is turned ON. As a result, the predetermined voltage $E_H$ is supplied to the thermal head 20 through a line 86. In the resistance measurement mode, the transistor 85 is turned ON upon a signal from the resistance measuring section 43*a*. When the transistor 85 is turned ON, the gate voltage of the FET 82 is lowered to turn the FET 82 OFF and thus turn the switch Sb OFF. As a result, the discharge current from the capacitor 50 of the thermal head 20 tries to flow through the Zener diode 83 and the transistor 85, but the diode 84 prevents this current flow. Therefore, all of the discharge current from the capacitor 50 is supplied to the heating element, so that measurement error may not be caused by the switch Sb.

Although the reference voltage Vref is defined at $(1/2)E_H$ according to the above embodiments, the reference voltage is not limited to this value, but may be $(1/3)E_H$ or $(2/3)E_H$. However, it is to be noted that, if the reference voltage is set nearer to the power supply voltage $E_H$, indeed the discharge time of the capacitor to be detected for the resistance measurement becomes shorter, but the precision of resistance measurement declines. If, on the other hand, the reference voltage is set at or nearer to zero, the slope of the discharging curve becomes gentle, which not only elongates the measurement time but also diminishes the precision of measurement. Therefore, the reference voltage Vref is preferably set at $(1/2)E_H$.

Figure 9:
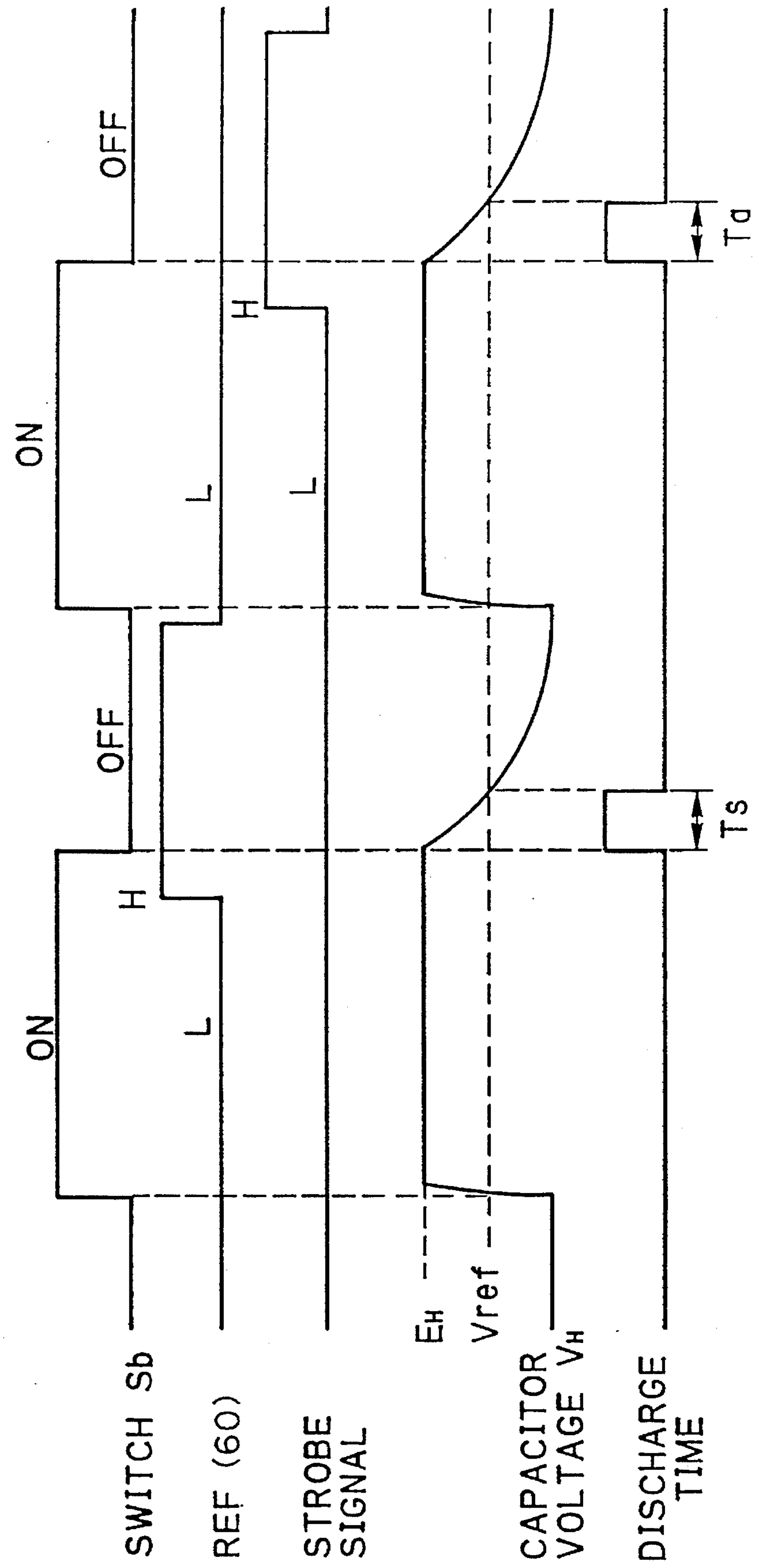
FIG. 9 shows time charts of signals applied to the respective circuits shown in FIG. 8.

In the embodiment shown in FIGS. 8 and 9, charging and discharging of the capacitor 50 is performed after the heating element or the reference resistor 60 is turned ON. However, it is possible to turn the heating element or the reference resistor 60 ON only while the capacitor 50 is discharged.

Furthermore, it is possible to generate correction pulses and insert them between the pulses of the drive data, wherein the number of the correction pulses depends upon the correction data calculated based on the measured resistance values and the ideal resistance value.

Although the above described embodiment only relates to a line printer wherein a plurality of heating elements are arranged in the main scan direction, and the recording paper is moved linearly relative to the thermal head in the subsidiary scan direction, the present invention is applicable to serial printers wherein pixels are serially printed by a two-dimensional movement of the recording paper relative to the thermal head.

Of course, the present invention is applicable not only to the direct color thermal printer as described so far, but also to monochromatic thermal printers or other type thermal printers, such as thermal wax transfer and thermal dye transfer or sublimation-type thermal transfer recording type printer. It is also possible to provide two optical fixing devices for yellow and magenta which radiate electromagnetic rays having wave lengths of 420 nm and 365 nm, respectively, instead of using a single ultraviolet lamp in combination with a sharp-cut filter.

Furthermore, the order of lamination of the color recording layers on the supporting layer is not limited to the above described embodiment, but may be changed appropriately. In that case, it is unnecessary to provide the innermost color recording layer with the capacity of being optically fixed. Of course, it is possible to provide that capacity to the innermost color recording layer.

While the present invention has been described with reference to the embodiment shown in the drawings, the invention should not be limited by the embodiment but, on the contrary, various modifications of the present invention can be effected without departing from the spirit and scope of the appended claims.

What is claimed is:

1. A resistance measuring method for a thermal head having a plurality of heating elements connected in parallel to one another and arranged in an array, said method comprising the steps of:

charging a capacitor up to a first voltage level, said capacitor being connected in parallel with said heating elements;

turning one of said heating elements ON, so as to discharge said capacitor through said one heating element whose resistance is to be measured;

measuring discharge time required to discharge said capacitor from said first voltage level to a second voltage level; and calculating a resistance value of said one heating element on the basis of said measured discharge time.

2. The resistance measuring method as recited in claim 1, wherein each of said heating elements is turned ON by a corresponding one of a plurality of drive switches which are respectively connected in series to said heating elements.

3. The resistance measuring method as recited in claim 2, wherein said capacitor is connected to a power supply circuit through a charge switch, such that said capacitor is charged by said power supply circuit when said charge switch is ON, and that said charge switch is turned OFF to disconnect said heating elements and said capacitor from said power supply circuit.

4. The resistance measuring method as recited in claim 3, wherein said second voltage level is a half of said first voltage level.

5. The resistance measuring method as recited in claim 3, wherein said resistance value is calculated based on said discharge time and capacity of said capacitor.

6. The resistance measuring method as recited in claim 3, wherein a reference resistor whose resistance is known is connected in parallel to said heating element, and said resistance value of said one heating element is calculated based on said discharge time measured relating to said one heating element and a reference discharge time detected in relation to said reference resistor.

7. A resistance measuring device for a thermal head having an array of parallel connected heating elements which are heated by a voltage supplied from a power supply circuit during printing, an array of drive switches which are connected in series to said heating elements in one to one relation, and a switch control circuit for ON-OFF controlling of said drive switches, the resistance measuring device comprising:

a capacitor connected to said power supply circuit in parallel with said heating element array;

a charge switch connected between said power supply circuit and said capacitor, said charge switch being turned ON to charge said capacitor up to a first voltage level by said power supply circuit and being turned OFF to disconnect said heating element and said capacitor from said power supply circuit;

discharge time measuring means for measuring discharge time required to discharge said capacitor from said first voltage level to a second voltage level when said charge switch is turned OFF and one of said drive switches is turned ON to discharge said capacitor through a corresponding one of said heating elements; and resistance value calculating means for calculating a resistance value of said corresponding one of said heating elements on the basis of said measured discharge time.

8. The resistance measuring device as recited in claim 7, wherein said discharge time measuring means comprises a comparator for outputting a detection signal when the voltage of said capacitor decreases down to said second voltage level and a timer which starts time-counting with the start of discharging of said capacitor and stops time-counting upon generation of said detection signal.

9. The resistance measuring device as recited in claim 8, wherein said resistance value calculating means calculates said resistance value based on said discharge time and capacity of said capacitor.

10. The resistance measuring device as recited in claim 8, further comprising:

a reference resistor connected in parallel to said heating elements, resistance a of said reference resistor being predetermined and a secondary drive switch connected in series to said reference resistor, wherein said resistance calculating means calculates said resistance value of said one heating element on the basis of said discharge time measured relating to said one heating element and a reference discharge time detected in relation to said reference resistor.

11. A thermal printer using a terminal head for thermal printing, said thermal head having an array of parallel connected heating elements which are heated by a voltage supplied from a power supply circuit during printing, an array of drive switches which are connected in series to said heating elements in one to one relation, and a switch control circuit for ON-OFF controlling of said drive switches, the thermal printer comprising:

a capacitor connected to said power supply circuit in parallel with said heating element array;

charge switch means connected between said power supply circuit and said capacitor, said charge switch means being turned ON to charge said capacitor up to a first voltage level by said power supply circuit, and turned OFF to disconnect said heating element and said capacitor from said power supply circuit;

discharge time measuring means for measuring discharge time required to discharge said capacitor from said first voltage level to a second voltage level when said charge switch means is turned OFF and one of said drive switch is turned ON to discharge said capacitor through a corresponding one of said heating elements;

calculating means for calculating a resistance value of said corresponding one of said heating elements on the basis of said measured discharge time; and correcting means for correcting image data on the basis of resistance values of said heating elements detected through said calculating means.

12. The thermal printer as recited in claim 11, wherein said discharge time measuring means comprises a comparator outputting a detection signal when the voltage of said capacitor decreases down to said second voltage level and a timer which starts time-counting with the start of discharging of said capacitor and stops time-counting upon generation of said detection signal.

13. The thermal printer as recited in claim 12, wherein said correcting means includes a memory for storing said resistance values, a calculating device for calculating correction data on the basis of a difference between each of said resistance values and an ideal resistance value, and a device for correcting said image data by using said correction data.

14. The thermal printer as recited in claim 13, wherein said power supply circuit comprises a first rectifier for converting a first alternating current into a first direct current, an inverter for converting said first direct current into a second alternating current whose frequency is variable, a step-up transformer for transforming said second alternating current into a third alternating current, and a second rectifier for converting said third alternating current into a second direct current.

15. The thermal printer as recited in claim 14, wherein said power supply circuit further comprises an additional comparator for outputting a control signal to control the frequency of said inverter so as to maintain the voltage of said second direct current constant.

16. The thermal printer as recited in claim 15, wherein said charge switch means comprises a transistor which is ON-OFF controlled by a signal from said discharge time measuring means, and a field effect transistor connected between said second rectifier and said capacitor, said field effect transistor being turned ON when said transistor is turned OFF so as to connect said second rectifier to said capacitor and said heating elements.

17. The thermal printer as recited in claim 16, wherein said step-up transformer has first and second taps connected to opposite ends of a secondary coil, and a third tap connected to an intermediate portion of said secondary coil, and said second rectifier converts said third alternating current from said first to third taps into said second direct current having high and low voltage levels and a ground voltage.

18. The thermal printer as recited in claim 17, wherein said field effect transistor has a gate applied with said high voltage, a drain applied with said low voltage, and a source connected to said capacitor, and said transistor is connected to the gate of said field effect transistor so as to control the gate voltage.

19. The thermal printer as recited in claim 18, wherein said charge switch means further comprises a Zener diode for maintaining voltage between said gate and said source of said field effect transistor constant, and a diode for preventing flowing of the discharge current from said capacitor to the gate of said field effect transistor through said Zener diode.

20. The thermal printer as recited in claim 13, wherein said calculating means calculates said resistance value based on said discharge time and capacity of said capacitor.

21. A thermal printer as recited in claim 13, further comprising:

a reference resistor connected in parallel to said heating elements, a resistance of said reference resistor being predetermined; and a secondary drive switch connected in series to said reference resistor, wherein said calculating means calculates said resistance value of said one heating element on the basis of said discharge time measured relating to said one heating element and a reference discharge time detected in relation to said reference resistor.

* * * * *